(12) United States Patent
Jo et al.

(10) Patent No.: US 11,502,710 B2
(45) Date of Patent: Nov. 15, 2022

(54) FRONT-END MODULE

(71) Applicant: Samsung Electro-Mechanics Co., Ltd., Suwon-si (KR)

(72) Inventors: Kang Ta Jo, Suwon-si (KR); Seong Jong Cheon, Suwon-si (KR); Se Jong Kim, Suwon-si (KR); Ho Taek Song, Suwon-si (KR); Jang Ho Park, Suwon-si (KR); Yoo Sam Na, Suwon-si (KR); Jae Hyouck Choi, Suwon-si (KR); Young Sik Hur, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 246 days.

(21) Appl. No.: 16/933,054

(22) Filed: Jul. 20, 2020

(65) Prior Publication Data

US 2021/0242892 A1 Aug. 5, 2021

(30) Foreign Application Priority Data

Feb. 5, 2020 (KR) .................. 10-2020-0013842
Apr. 2, 2020 (KR) .................. 10-2020-0040211

(51) Int. Cl.
*H04B 1/10* (2006.01)
*H01Q 1/38* (2006.01)
(Continued)

(52) U.S. Cl.
CPC ......... *H04B 1/1018* (2013.01); *H01Q 1/2283* (2013.01); *H01Q 1/38* (2013.01); *H04B 1/04* (2013.01)

(58) Field of Classification Search
CPC ............. H01L 25/0652; H01L 23/5383; H01L 2924/19105; H01L 2225/06548;
(Continued)

(56) References Cited

U.S. PATENT DOCUMENTS 8,890,628 B2 * 11/2014 Nair ................. H01L 23/552
257/416
2013/0101251 A1 * 4/2013 Kawamura ........... G02B 6/428
174/266

(Continued)

FOREIGN PATENT DOCUMENTS

KR 10-2009-0066361 A 6/2009
KR 10-1472638 B1 12/2014
KR 10-2019-0118326 A 10/2019

*Primary Examiner* — Aristocratis Fotakis
(74) *Attorney, Agent, or Firm* — NSIP Law

(57) ABSTRACT

A front-end module includes: a substrate including a first connection member in which at least one first insulating layer and at least one first wiring layer are alternately stacked, a second connection member in which at least one second insulating layer and at least one second wiring layer are alternately stacked, and a core member disposed between the first and second connection members; a radio-frequency component mounted on a surface of the substrate and configured to amplify a main band of an input RF signal or filter bands outside the main band; an inductor disposed on a surface of the core member and electrically connected to the radio-frequency component; and a ground plane disposed on another surface of the core member. The core member includes a core insulating layer thicker than an insulating layer among at least one first insulating layer and the at least one second insulating layer.

16 Claims, 14 Drawing Sheets

(51) Int. Cl.
*H04B 1/04* (2006.01)
*H01Q 1/22* (2006.01)

(58) Field of Classification Search
CPC ........ H01L 2924/19042; H01Q 1/2283; H01Q 1/38; H01Q 9/0414
See application file for complete search history.

(56) References Cited

U.S. PATENT DOCUMENTS

| | | | |
|---|---|---|---|
| 2014/0126156 A1* | 5/2014 | Naganuma | H05K 1/0233 |
| | | | 361/720 |
| 2014/0185258 A1 | 7/2014 | Lee et al. | |
| 2014/0253794 A1* | 9/2014 | Miyazaki | H04N 5/2257 |
| | | | 348/373 |
| 2015/0119104 A1* | 4/2015 | Saji | H04B 1/525 |
| | | | 455/553.1 |
| 2018/0159203 A1* | 6/2018 | Baks | H01Q 1/48 |
| 2020/0013735 A1* | 1/2020 | Liu | H01L 23/481 |
| 2020/0058592 A1* | 2/2020 | Kim | H01L 23/62 |
| 2021/0006283 A1* | 1/2021 | Harada | H05K 1/0251 |
| 2021/0313283 A1* | 10/2021 | Wilson | H01L 23/4334 |

* cited by examiner

FRONT-END MODULE

CROSS-REFERENCE TO RELATED APPLICATIONS

This application claims the benefit under 35 U.S.C. § 119(a) of Korean Patent Application Nos. 10-2020-0013842 and 10-2020-0040211 filed on Feb. 5, 2020 and Apr. 2, 2020, respectively, in the Korean Intellectual Property Office, the entire disclosures of which are incorporated herein by reference for all purposes.

BACKGROUND

1. Field

The following description relates to a front-end module.

2. Description of Related Art

As portable terminals are miniaturized and multi-functionalized, the importance of light, thin, short, and small components is increasing. For example, for module miniaturization, front-end modules have been developed by various methods including by being provided with a miniaturized mounting component having a reduced size of 0.2 mm×0.1 mm from 0.4 mm×0.2 mm or minimizing a number of mounting components and/or a number of functions of mounting components.

Generally, a printed circuit board (PCB) applied to a front-end module may provide a mounting space for a passive element and an active element. As an operating frequency increases, however, a size and a number of components mounted on a substrate increase. Further, there are limitations to implementing the components as a single module within the substrate. That is, as there are limitations on a number of the components and/or a number of functions of the components mountable on the substrate, it may be difficult to reduce the size of the front-end module.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a front-end module includes: a substrate including a first connection member having a first stack structure in which at least one first insulating layer and at least one first wiring layer are alternately stacked, a second connection member having a second stack structure in which at least one second insulating layer and at least one second wiring layer are alternately stacked, and a core member disposed between the first and second connection members; a radio-frequency component mounted on a first surface of the substrate and configured to amplify a main band of an input radio frequency (RF) signal or filter one or more bands outside the main band; an inductor disposed on a first surface of the core member and electrically connected to the radio-frequency component; and a ground plane disposed on a second surface of the core member. The core member includes a core insulating layer thicker than an insulating layer among at least one first insulating layer and at least one second insulating layer.

The ground plane may be disposed to overlap with at least a portion of the inductor in a normal direction of the first surface of the core member.

The ground plane may be electrically connected to the radio-frequency component.

The substrate may be configured to receive a pre-amplified or pre-filtered RF signal through a second surface of the substrate and provide the amplified or filtered RF through the second surface of the substrate.

The front-end module may further include a second radio-frequency component mounted on the second surface of the substrate.

The front-end module may further include a reactance component electrically connected to the radio-frequency component. The core insulating layer may form a cavity in which the reactance component is disposed.

The substrate may further include a third connection member disposed between the first connection member and the core member, and having a third stack structure in which at least one third insulating layer and at least one third wiring layer are alternately stacked, The core insulating layer and the third connection member may surround the cavity.

The substrate may include a metal layer covering the cavity and disposed between the first and second connection members. At least a portion of the metal layer may be disposed on one surface of the reactance component.

A distance between the inductor and the ground plane may be greater than 105 μm.

A distance between the inductor and the ground plane may be about 147 μm.

In another general aspect, a front-end module includes: a substrate including a first connection member having a first stack structure in which at least one first insulating layer and at least one first wiring layer are alternately stacked, a second connection member having a second stack structure in which at least one second insulating layer and at least one second wiring layer are alternately stacked, and a core member disposed between the first and second connection members; a radio-frequency component mounted on a first surface of the substrate and configured to amplify a main band of an input radio frequency (RF) signal or filter one or more bands outside the main band; and a reactance component electrically connected to the radio-frequency component. The core member includes a core insulating layer thicker than an insulating layer among the at least one first insulating layer and the at least one second insulating layer, and forms a cavity in which the reactance component is disposed.

The substrate may further include a third connection member disposed between the first connection member and the core member, and having a third stack structure in which at least one third insulating layer and at least one third wiring layer are alternately stacked. The core insulating layer and the third connection member may surround the cavity.

The substrate may further include a metal layer covering the cavity and disposed between the first and second connection members. At least a portion of the metal layer may be disposed on one surface of the reactance component.

The substrate may be configured to receive a pre-amplified or pre-filtered RF signal through a second surface of the substrate and provide an amplified or filtered RF signal through the second surface of the substrate.

The front-end module may further include a second radio-frequency component mounted on the second surface of the substrate.

The front-end module may further include a second reactance component electrically connected to the radio-frequency component. The core insulating layer may form a second cavity in which the second reactance component is disposed.

The front-end module may further include an inductor disposed on a first surface of the core member and electrically connected to the radio-frequency component.

The front-end module may further include a ground plane disposed on a second surface of the core member and electrically connected to the radio-frequency component.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1A:
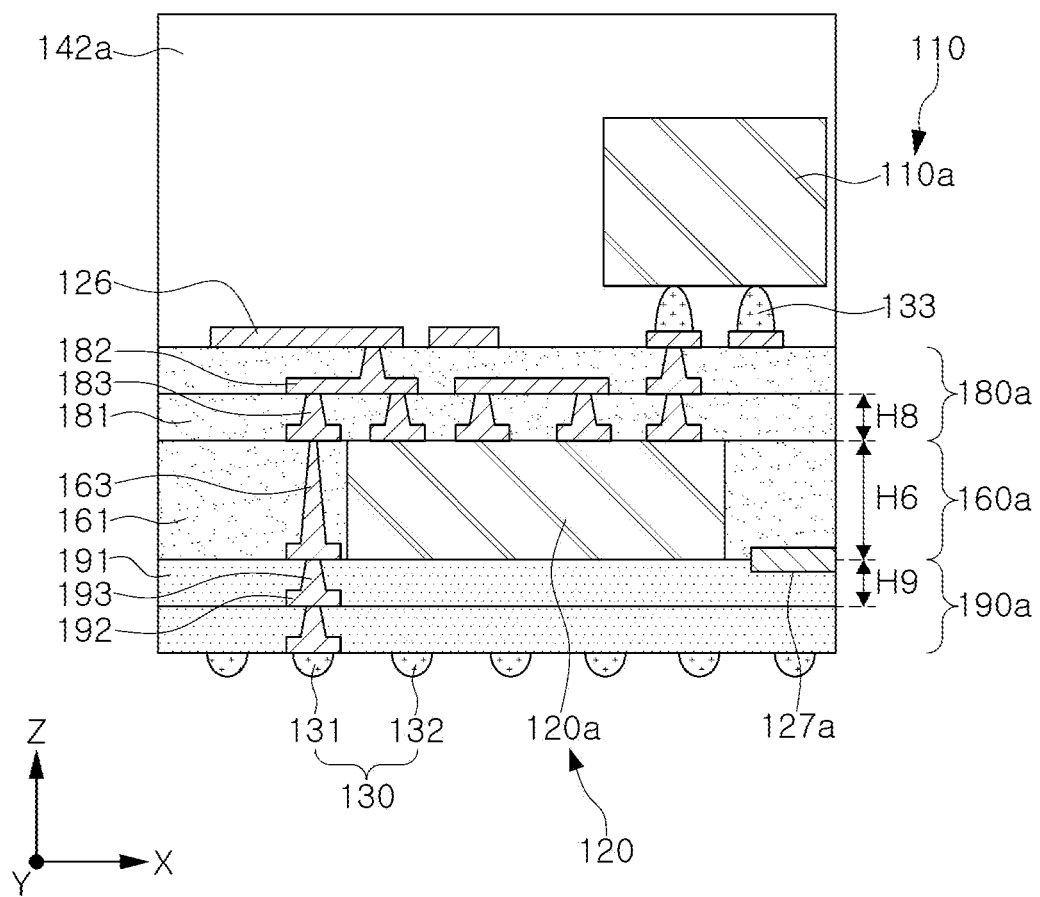
FIGS. 1A to 1D are side views of a front-end module, according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," "lower," "front," "rear," and "side" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. For another example, if the device in the figures is turned around, an element described as being "front" relative to another element will then be "rear" relative to the other element. Thus, the term "front" encompasses both the front and rear orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIGS. 1A to 1D are side views of a front-end module 100a, according to an embodiment.

Referring to FIG. 1A, the front-end module 100a may include, for example, a first connection member 190a, a second connection member 180a, and a core member 160a.

The first connection member 190a may have a first stack structure in which at least one first insulating layer 191 and at least one first wiring layer 192 are alternately stacked, and may further include a first via 193 connected to the at least one first wiring layer 192 and disposed to pass through the at least one first insulating layer 191.

The second connection member 180a may have a first stack structure in which at least one second insulating layer 181 and at least one second wiring layer 182 are alternately stacked, and may further include a second via 183 connected to the at least one second wiring layer 182 and disposed to pass through the at least one second insulating layer 181.

For example, the first and second connection members 190a and 180a may have a stack structure similar to a printed circuit board (PCB). Numbers of the wiring layers and the insulating layers of the first and second connection members 190a and 180a are not particularly limited.

The core member 160a may be disposed between the first and second connection members 190a and 180a, and may include a core insulating layer 161 and a core via 163 penetrating the core insulating layer 161 to electrically connect the first and second connection members 190a and 180a to each other.

Referring to FIG. 1A, the front-end module 100a may further include a radio-frequency component 110, an inductor 126 and a ground plane 127a.

The radio-frequency component 110 is mounted on an upper surface of the second connection member 180a and may be configured to amplify a main band of an input radio frequency (RF) signal or filter one or more bands outside the main band.

For example, the radio-frequency component 110 may include a radio-frequency amplifier 110a configured to amplify the main band of the input RF signal and/or a radio-frequency filter configured to filter one or more bands outside the main band of the RF signal. Power of the amplified RF signal may be greater than that of the RF signal before being amplified, and a noise of the filtered RF signal may be smaller than that of the RF signal before being filtered.

For example, the radio-frequency component 110 may be implemented as an integrated circuit (IC) or a combination of a semiconductor transistor element and/or an impedance element.

For example, the radio-frequency amplifier 110a may include a power amplifier configured to amplify an RF signal to be received and/or a low noise amplifier configured to amplify the received RF signal, and may be implemented based on a silicon semiconductor or a compound semiconductor, but is not limited to these examples.

For example, the radio-frequency amplifier 110a may include a semiconductor transistor element having a common source (CS) structure or a common gate (CG) structure and may use an amplification gain based on transconductance and output impedance of the semiconductor transistor element to amplify the RF signal. The main band of the radio-frequency amplifier 110a may be determined by the output impedance and parasitic impedance.

A required size of a means for providing the output impedance may be relatively large as compared to that of a semiconductor transistor element, and the element for providing the output impedance may have passive characteristics different from active characteristics of the semiconductor transistor element. Accordingly, at least a portion of the means for providing the output impedance is separated from the radio-frequency amplifier 110a, thereby reducing a size off the radio-frequency amplifier 110a or improving overall performance (e.g., amplification efficiency, power consumption, noise figure) thereof.

The inductor 126 may be at least a portion of the means for providing the output impedance and may be disposed on an upper surface of the core member 160a and electrically connected to the radio-frequency component 110.

For example, the inductor 126 may provide inductance to the radio-frequency component 110, and according to a design thereof, a plurality of inductors may be electromagnetically coupled to form a transformer or a balun.

The inductor 126 may have a small resistance, and the resistance may induce energy loss of the RF signal or deterioration of performance of the radio-frequency amplifier 110a. Accordingly, a ratio of inductance to resistance of the inductor 126 may correspond to a Q factor of the inductor 126. Further, overall performance of the front-end module 100a may improve as the inductor 126 has a little resistance and a high Q factor.

A factor for increasing the resistance of the inductor 126 may be a ground plane of a substrate. The ground plane may provide an electric reference ground to the entire front-end module. The larger the surface areas of upper and lower surfaces of a conductive structure corresponding to the ground plane, the more electrically stable the ground plane can be, and thus, the ground plane may have a relatively large surface area.

The ground plane, however, may induce an eddy current caused by a magnetic flux corresponding to inductance of the inductor 126, and the eddy current may act as resistance of the inductor 126. The eddy current may be reduced as a distance between the inductor 126 and the ground plane increases.

A ground plane 127a of the front-end module 100a may be disposed on a lower surface of the core insulating layer 161.

The core insulating layer 161 may have a thickness H6 larger than a thickness H9 or H8 of a single insulating layer of at least one of the first and second insulating layers 191 and 181. For example, the thickness H6 of the core insulating layer 161 may be greater than the thickness H9 of each of the first insulating layers 191 and the thickness H8 of each of the second insulating layers 181.

Due to the comparatively large thickness of the core insulating layer 161, a distance between the ground plane 127a and the inductor 126 may easily be increased, and a Q factor of the inductor 126 may further increase. In addition, the electric characteristics (e.g., energy loss, power consumption, or the like) of the front-end module 100a may be improved.

Referring to FIG. 1A, the front-end module 100a may further include a reactance component 120 electrically connected to the radio-frequency component 110.

The reactance component 120 may provide capacitance and/or inductance to the radio-frequency component 110 and may include a first reactance component 120a.

In this regard, the radio-frequency component 110 may be received with high reactance from outside and thus can have further improved or deteriorated performance or may perform more various operations.

The core insulating layer 161 may provide a cavity in which the reactance component 120 is disposed. That is, the reactance component 120 may be built in a substrate formed by the first connection member 190a, the second connection member 180a, and the core member 160a.

Accordingly, the front-end module 100a does not need to provide additional upper and lower surfaces on which to arrange the reactance component 120. Thus, front-end module 100a may have further improved performance for its size.

For example, the core insulating layer 161 has a relatively large thickness H6 and thus can provide the cavity with greater stability. Warpage of the substrate in accordance with provision of the cavity may be reduced.

For example, the cavity may be implemented as a through-cavity passing entirely through the core insulating layer 161 or a blind cavity to be described below with reference to FIGS. 4 to 5D.

The through-cavity may be formed by removing a certain region of the core insulating layer 161 from an upper surface to a lower surface thereof. A support film may be then disposed on the lower surface or an upper surface of the core insulating layer 161. The reactance component 120 may be disposed on an upper or lower surface of the support film. For example, the through-cavity may be formed by a machine having a protruding structure as the machine pushes down the certain region, a laser irradiated on the certain region, or several fine particles colliding intensively on the certain region.

For example, the reactance component 120 may be disposed to overlap the radio-frequency component 110 in a vertical direction (e.g., z direction). Thus, an electrical path between the radio-frequency component 110 and the reactance component 120 may be simplified, and an electrical length between the radio-frequency component 110 and the reactance component 120 may be reduced. Accordingly, the front-end module 100a may minimize transmission loss due to the electrical length between the radio-frequency component 110 and the reactance component 120, and parasitic impedance of the electrical connection path, thereby resulting in more effectively improved electric characteristics.

Referring to FIG. 1A, the front-end module 100a may further include an electrical connection structure 130 and an encapsulant 142a.

The electrical connection structure 130 may include at least one first electrical connection structure 131, at least one second electrical connection structure 132 and at least one third electrical connection structure 133. For example, the electrical connection structure 130 may be implemented as solder balls, pads, lands, or the like, and at least a portion thereof may have a lower melting point that the wiring layer.

The first electrical connection structure 131 may be disposed on a lower surface of the substrate (e.g., a lower surface of a lowermost first insulating layer 191), and may be configured as a path for inputting/outputting an RF signal of the front-end module 100a from/to outside. That is, the substrate may receive a pre-amplified or pre-filtered RF signal through the first electrical connection structure 131, and may provide an amplified or filtered RF signal through the first electrical connection structure 131 on the lower surface of the substrate.

The second electrical connection structure 132 may be formed on the lower surface of the substrate (e.g., a lower surface of a lowermost first insulating layer 191), and may support mounting of the front-end module 100a on a different substrate. The third electrical connection structure 133 may be formed on an upper surface of an uppermost second insulating layer 181, and may support mounting of the radio-frequency component 110 on the substrate.

The encapsulant 142a may seal at least a portion of the radio-frequency component 110. For example, the encapsulant 142a may be implemented by a photo imageable encapsulant (PIE), Ajinomoto build-up film (ABF), an epoxy molding compound (EMC), or the like. For example, a portion of the encapsulant 142a may be filled in a gap in the cavity, in which the reactance component 120 is not located.

Figure 1B:
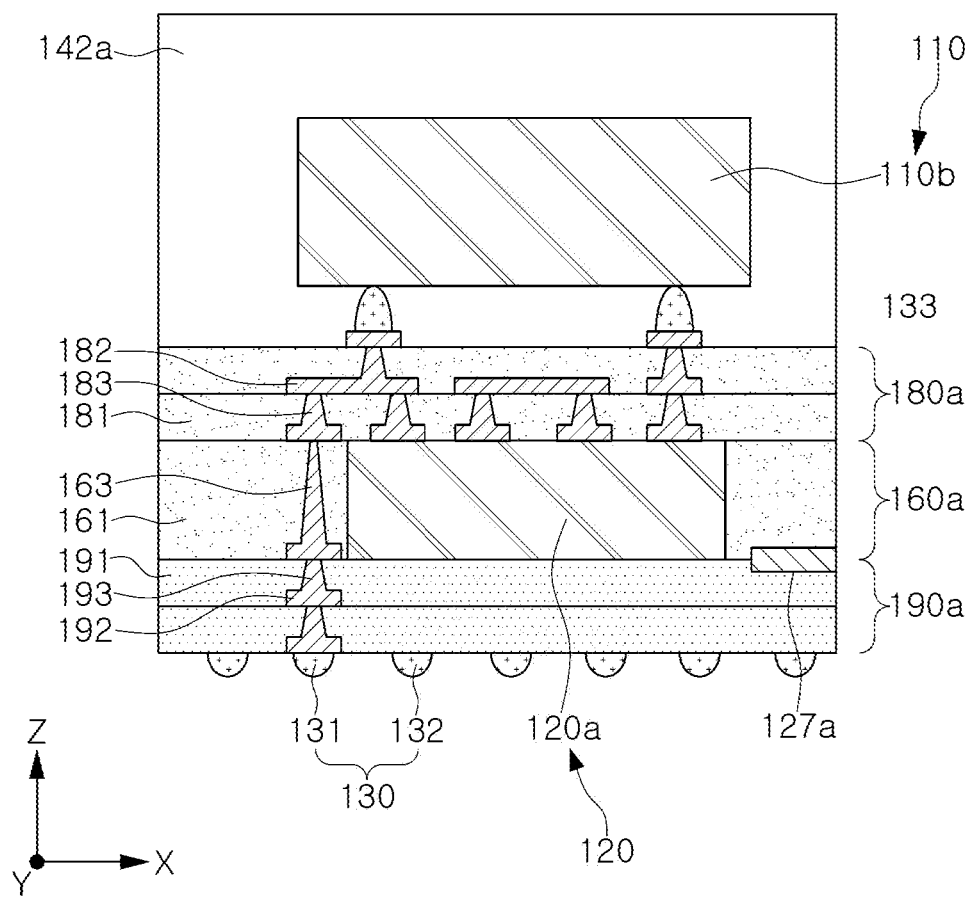
Figure 1C:
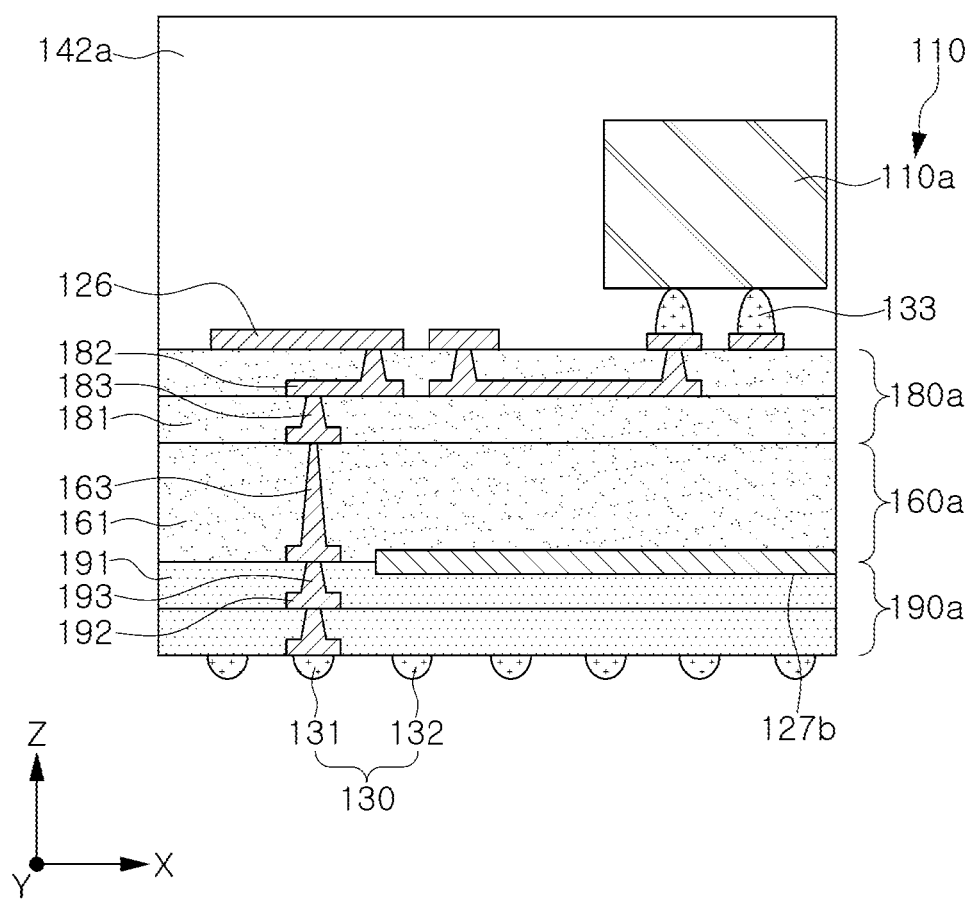

Referring to FIG. 1B, a front-end module 100b, according to an embodiment, may have a structure in which the inductor illustrated in FIG. 1A is omitted, and the reactance component 120 functions similarly to the inductor of FIG. 1A.

The radio-frequency component 110 may include a radio-frequency filter 110b instead of the radio-frequency amplifier illustrated in FIG. 1A. The radio-frequency filter 110b may be configured to filter one or more bands outside the main band of the input RF signal.

For example, the radio-frequency filter 110b may have a resonance frequency and/or an anti-resonance frequency corresponding to a minimum and/or maximum frequency of the main band, and may have attenuation characteristics (e.g., a gradient of S-parameter at a cut-off frequency, or skirt characteristics) based on the resonance frequency and/or the anti-resonance frequency. For example, the radio-frequency filter 110b may include a bulk acoustic wave (BAW) resonator filter.

Since performance of the radio-frequency filter 110b may improve as the attenuation characteristics are strong or an insertion loss is reduced, a means for providing the resonance frequency and/or the anti-resonance frequency may improve the performance of the radio-frequency filter 110b.

A size of the means for providing the resonance frequency and/or the anti-resonance frequency may be relatively large and may have passive characteristics different from the filtering characteristics (e.g., characteristics of the BAW resonator filter) of the radio-frequency filter 110b. Accordingly, at least a portion of the means for providing the resonance frequency and/or the anti-resonance frequency may be separated from the radio-frequency filter 110b to reduce the size of the radio-frequency filter 110b or improve overall the performance (e.g., attenuation characteristics, or insertion loss) of the radio-frequency filter 110b.

Since the reactance of the reactance component 120 may correspond to the resonance frequency and/or the anti-resonance frequency, the reactance component 120 provides the reactance to the radio-frequency filter 110b to improve the attenuation characteristics. A high Q factor of the reactance component 120 may reduce the insertion loss of the radio-frequency filter 110b.

The core insulating layer 161 may provide a cavity in which the reactance component 120 is disposed. That is, the reactance component 120 may be built in the substrate formed by the first connection member 190a, the second connection member 180a, and the core member 160a.

Accordingly, the front-end module 100b does not need to provide additional upper and lower surfaces on which to arrange the reactance component 120. Thus, the front-end module 100b may have high performance for its size.

For example, the core insulating layer 161 has a relatively large thickness and thus can provide the cavity with greater stability. Warpage of the substrate in accordance with provision of the cavity may be reduced.

For example, the relatively large thickness of the core insulating layer 161 may further increase the size of the reactance of the reactance component 120 and facilitate mounting of a substrate of an inductor relatively higher than a capacitor.

Referring to FIG. 10, a front-end module 100c, according to an embodiment, may have a structure in which the reactance component and the cavity illustrated in FIGS. 1A and 1B are omitted and a distance between the inductor 126 and a ground plane 127b is increased, and thus has improved performance for its size.

For example, the ground plane 127b may be electrically connected to the radio-frequency component 110 and may provide a ground to the radio-frequency component 110.

For example, the ground plane 127b may be disposed to overlap with at least a portion of the inductor 126 in a normal direction (e.g., z direction) of one surface of the core member 160a. Accordingly, the ground plane 127b may provide a more stable ground to the overall front-end module 100c, and wiring of a wiring layer for ground provision may be simplified.

Figure 1D:
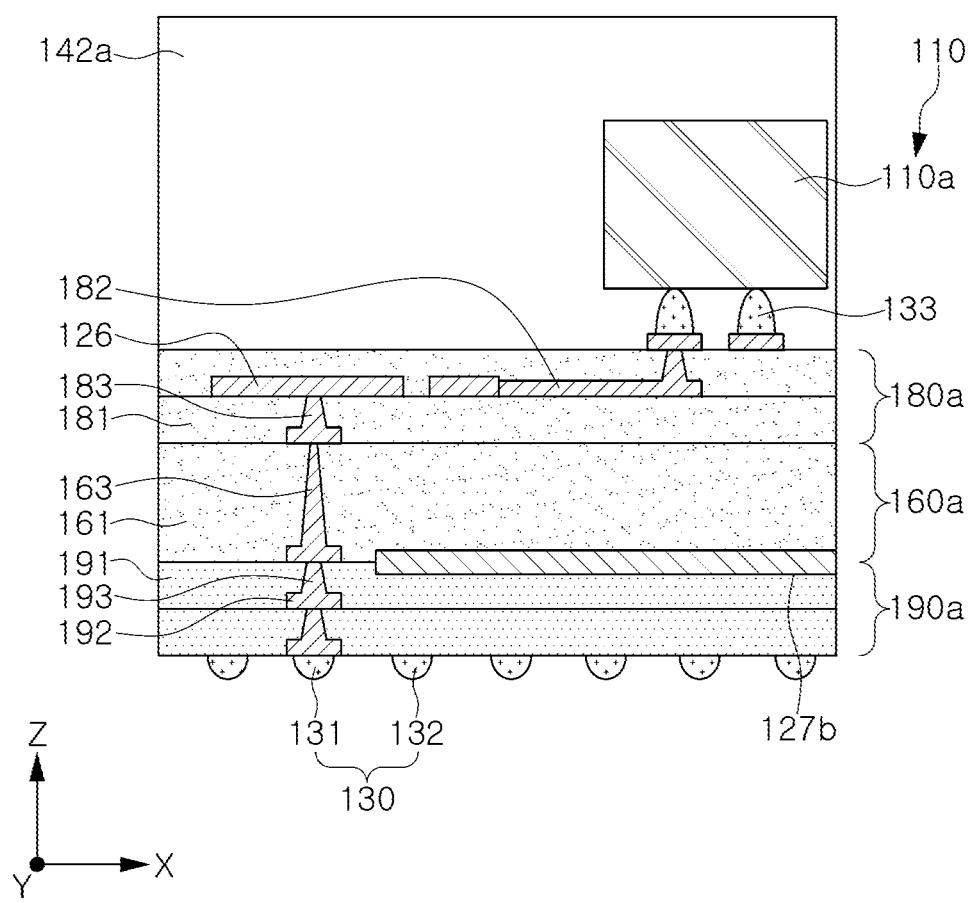

Referring to FIG. 1D, a front-end module 100d, according to an embodiment, may have a structure in which an inductor 126 is disposed on a lower level than the inductor illustrated in FIG. 1A. That is, the inductor 126 may be embedded in the substrate formed by the first connection member 190a, the second connection member 180a, and the core member 160a. For example, the inductor 126 may be disposed in the second connection member 180a.

Figure 2:
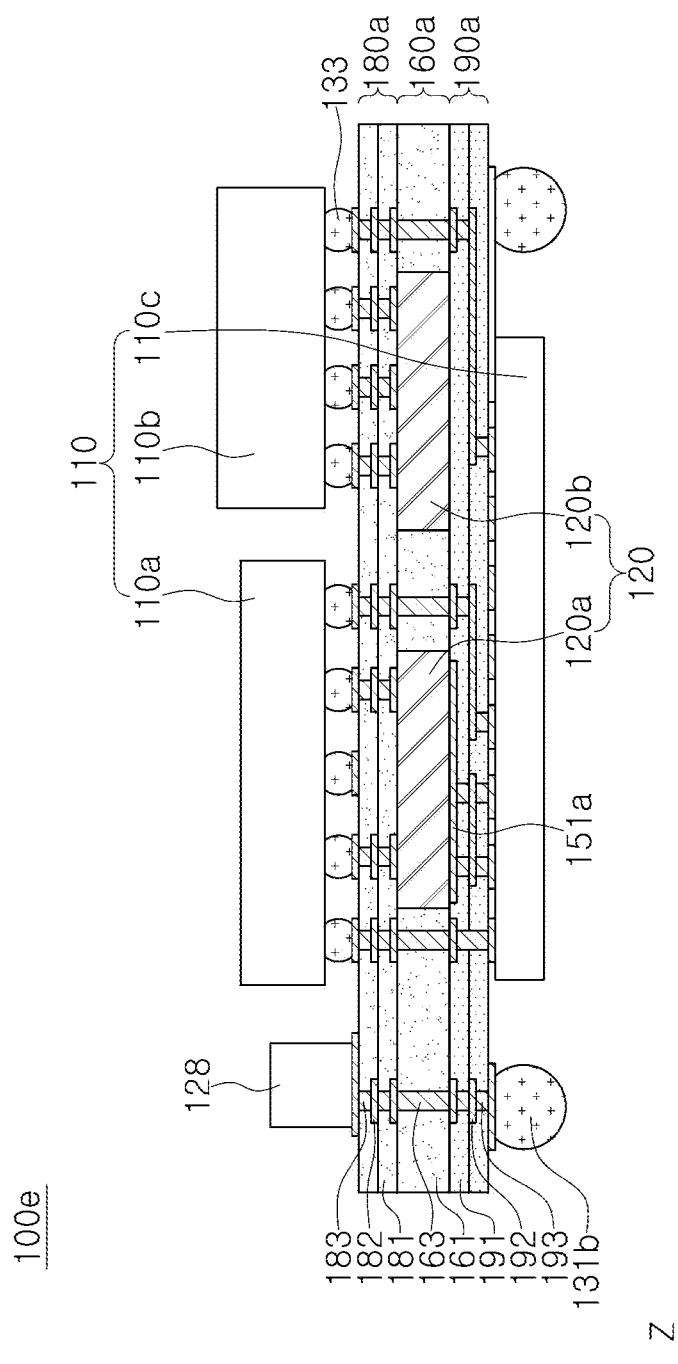
FIG. 2 is a side view illustrating a cavity-covering metal layer, a second reactance component, and a second radio-frequency component of a front-end module, according to an embodiment.

FIG. 2 is a side view illustrating a cavity-covering metal layer 151a, a second reactance component 120b, and a second radio-frequency component 110c of a front-end module 100e, according to an embodiment.

Referring FIG. 2, the front-end module 100e may further include, in comparison to the front-end module 100a of FIG. 1A, at least one cavity-covering metal layer 151a, at least one second reactance component 120b, and at least one second radio-frequency component 110c.

At least a portion of the cavity-covering layer 151a may be disposed on one surface of the reactance component 120 and between the first and second connection members 190a and 180a. The cavity-covering metal layer 151a may be used in formation of a blind cavity to be described with reference to FIGS. 4 to 5D.

Since the cavity-covering metal layer 151a may stop the formation of the cavity during the formation of the cavity in the core member 160a, a difference in size between the reactance component 120 and the cavity in the core member 160a may be reduced, thereby further improving stability of a substrate including the core member 160a and reducing a size of the substrate.

Depending on a design, the core member 160a may have a structure in which a plurality of cavities are formed, and the front-end module 100e may include first and second reactance components 120a and 120b independently disposed in a plurality of the cavities.

In this regard, the front-end module 100e may be enabled to smoothly implement a larger number of radio-frequency components and may have further deteriorated or improved performance or perform more various operations.

The radio-frequency amplifier 110a and the radio-frequency filter 110b of the radio-frequency component 110 may be disposed on the upper surface of the second connection member 180a of the substrate, and the second radio-frequency component 110c may be mounted on the lower surface of the first connection member 190a of the substrate. For example, the second radio-frequency component 110c may be configured to perform different operations (e.g., transmission/receipt switch) from those of the radio-frequency amplifier 110a or the radio-frequency filter 110b.

Accordingly, the front-end module 100e may suppress an increase in size in accordance with a number of the radio-frequency components. Thus, the front-end module 100e may have a reduced size for its performance.

The front-end module 100e may have mounting inductor 128 of a type that is different than that of the inductor 126 in the embodiments of FIGS. 1A, 10 and 1D. That is, the type of the inductor 128 included in the front-end module 100e is not particularly limited.

Figure 3A:
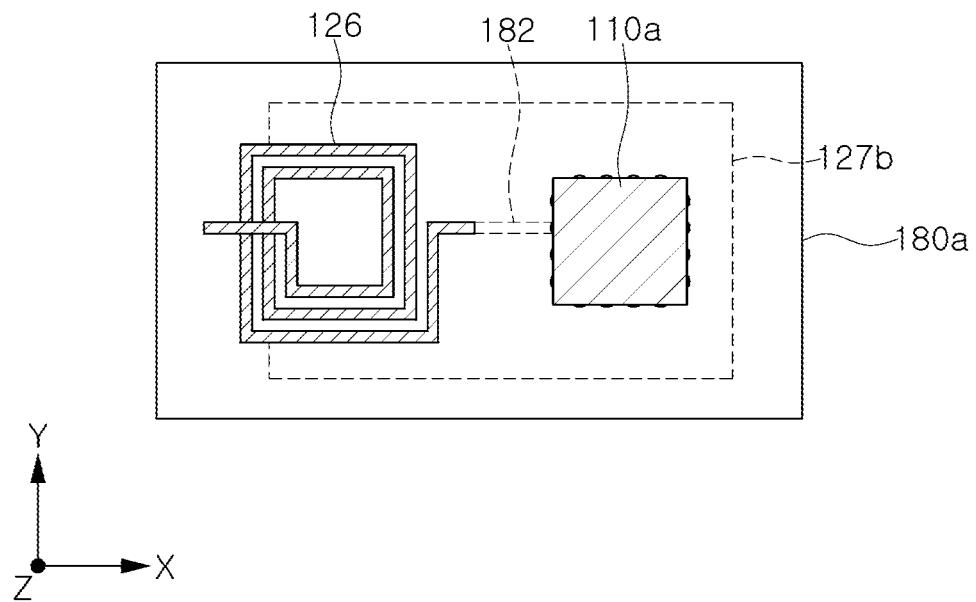
FIGS. 3A and 3B are planar views of a front-end module, according to an embodiment.
Figure 3B:
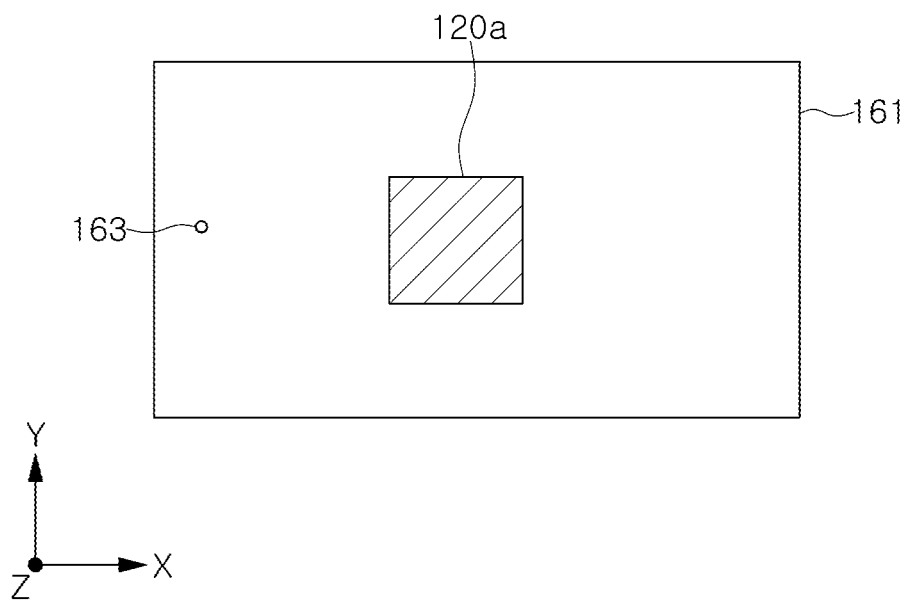

FIGS. 3A and 3B are planar views of a front-end module, according to an embodiment.

Referring to FIG. 3A, the inductor 126 may be implemented as a coil pattern extended from the second wiring layer 182 of the second connection member 180a.

At least a portion of the inductor 126 may overlap with the ground plane 127b in the vertical direction (e.g., z direction).

Referring to FIG. 3B, the core insulating layer 161 may surround the reactance component 120a and may provide a space in which to dispose the core via 163. The core via 163 may be electrically connected to an end of the inductor 126 illustrated in FIG. 3A.

Figure 4:
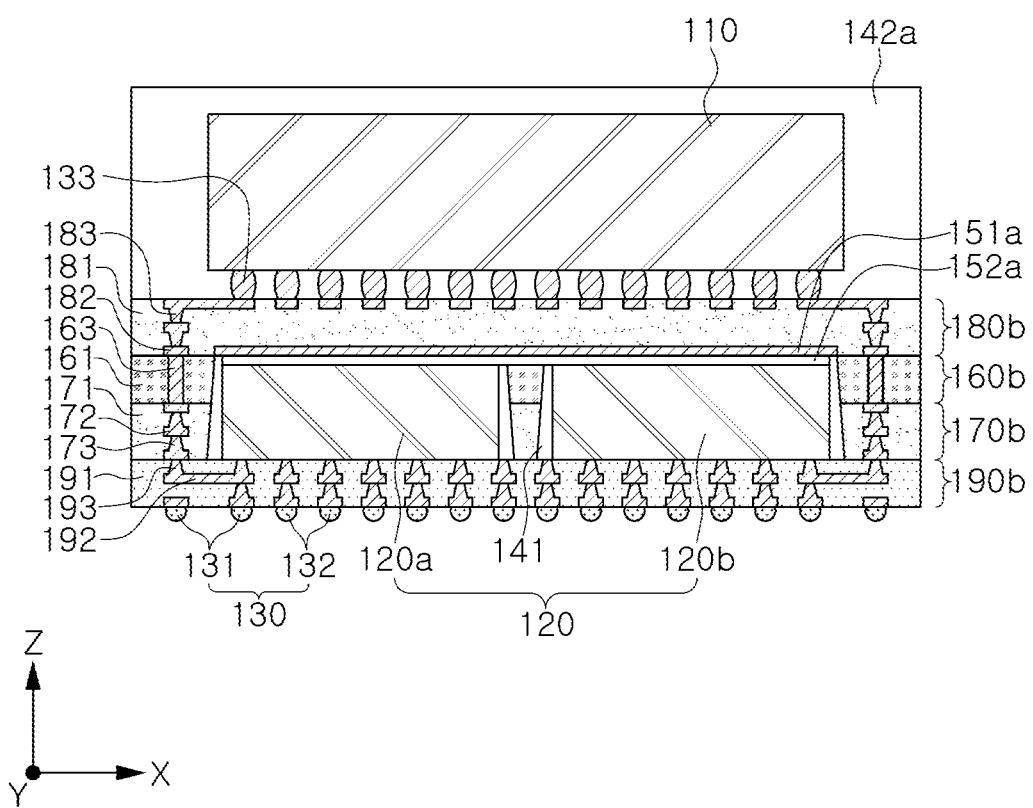
FIG. 4 is a side view of a substrate of a front-end module, according to an embodiment, in which a blind cavity is disposed.

FIG. 4 is a side view of a substrate of a front-end module 100f, according to an embodiment, in which a blind cavity is disposed.

Referring to FIG. 4, the front-end module 100f may include a first connection member 190b, a second connection member 180b, a third connection member 170b, and a core member 160b.

The third connection member 170b may have a third structure, in which at least one third insulating layer 171 and at least one third wiring layer 172 are alternately stacked, and may further include a third via 173 connected to the at least one third wiring layer 172 and disposed to pass through the at least one third insulating layer 171.

The first and second reactance components 120a and 120b may be independently disposed in a plurality of cavities. The core member 160b and the third connection member 170b may surround the plurality of cavities.

For example, the substrate formed by the first connection member 190b, the second connection member 180b, the third connection member 170b, and the core member 160b may provide the plurality of cavities through a process during which a region corresponding to the plurality of cavities is removed in a configuration in which the second connection member 180b, the third connection member 170b and the core member 160b are disposed.

The cavity-covering metal layer 151a may be used to stop the process during which the region corresponding to the plurality of cavities is removed and may be attached to the first and second reactance components 120a and 120b through an adhesive layer 152a. An encapsulant 141 may be filled in a portion of the plurality of cavities in which the first reactance components 120a and 120b are not located.

In the case in which an overall width in a horizontal direction of a cavity increases greatly as compared to an overall width in a horizontal direction of a substrate, structural stability of the substrate may be reduced, and there may be a higher risk of warpage of the substrate. The blind cavities of the front-end module 100f may have a relatively insignificant effect on the structural stability or possibility of warpage occurrence in the substrate formed by the first connection member 190b, the second connection member 180b, the third connection member 170b, and the core member 160b, in comparison to the through-cavity.

Accordingly, the blind cavities may have a comparatively large width in the horizontal direction even when the overall width in the horizontal direction of the substrate is small. Further, a number of the blind cavities may be easily increased even when the overall width in the horizontal direction of the substrate is small.

Accordingly, the front-end module 100f may suppress an increase in size due to the presence of the first and second reactance components 120a and 120b, and may have a reduced size for its performance.

FIGS. 5A to 5D are side views illustrating a manufacturing process of the front-end module 100f illustrated in FIG. 4, according to an embodiment.

Figure 5A:
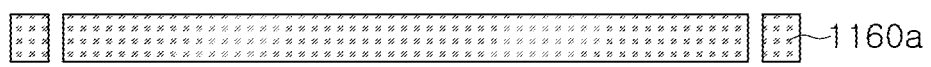
FIGS. 5A to 5D are side views illustrating a manufacturing process of the front-end module illustrated in FIG. 4, according to an embodiment.
Figure 5A:
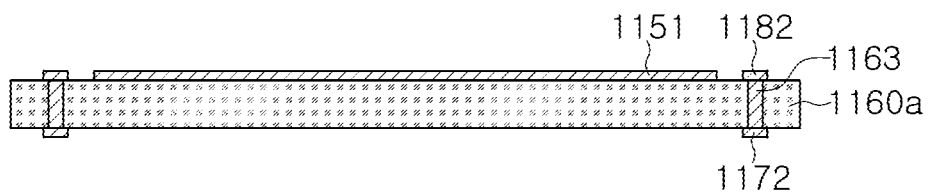
Figure 5A:
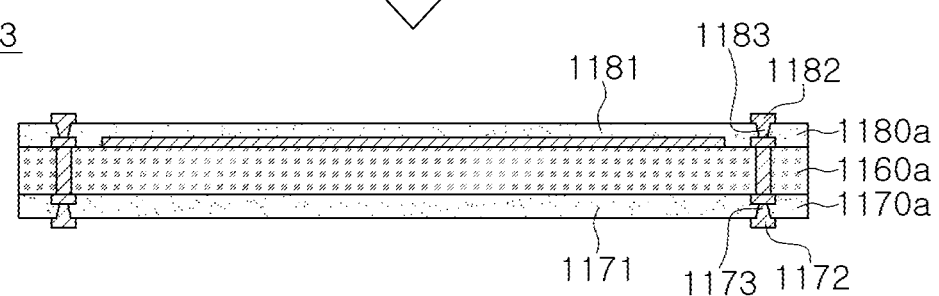
Figure 5A:
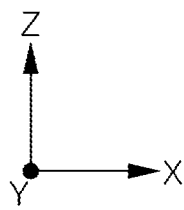

Referring to FIG. 5A, a portion in a core member 1160a, in which a core via is to be disposed, may be removed in a first operation 1001.

Referring to FIG. 5A, in a second operation 1002, a core via 1163 may be formed to pass through the core member 1160a, and a cavity-covering metal layer 1151 and a second wiring layer 1182 may be disposed on an upper surface of the core member 1160a while a third wiring layer 1172 is disposed on a lower surface of the core member 1160a.

Referring to FIG. 5A, in a third operation 1003, a third insulating layer 1171 may be disposed on a lower surface of the core member 1160a and a third via 1173 may be formed on the third insulating layer 1171. A second insulating layer 1181 may be disposed on an upper surface of the core member 1160a, and a second via 1183 may be formed on the second insulating layer 1181. Thus, partial layers of the third connection member 1170a and the second connection member 1180a may be formed.

Figure 5B:
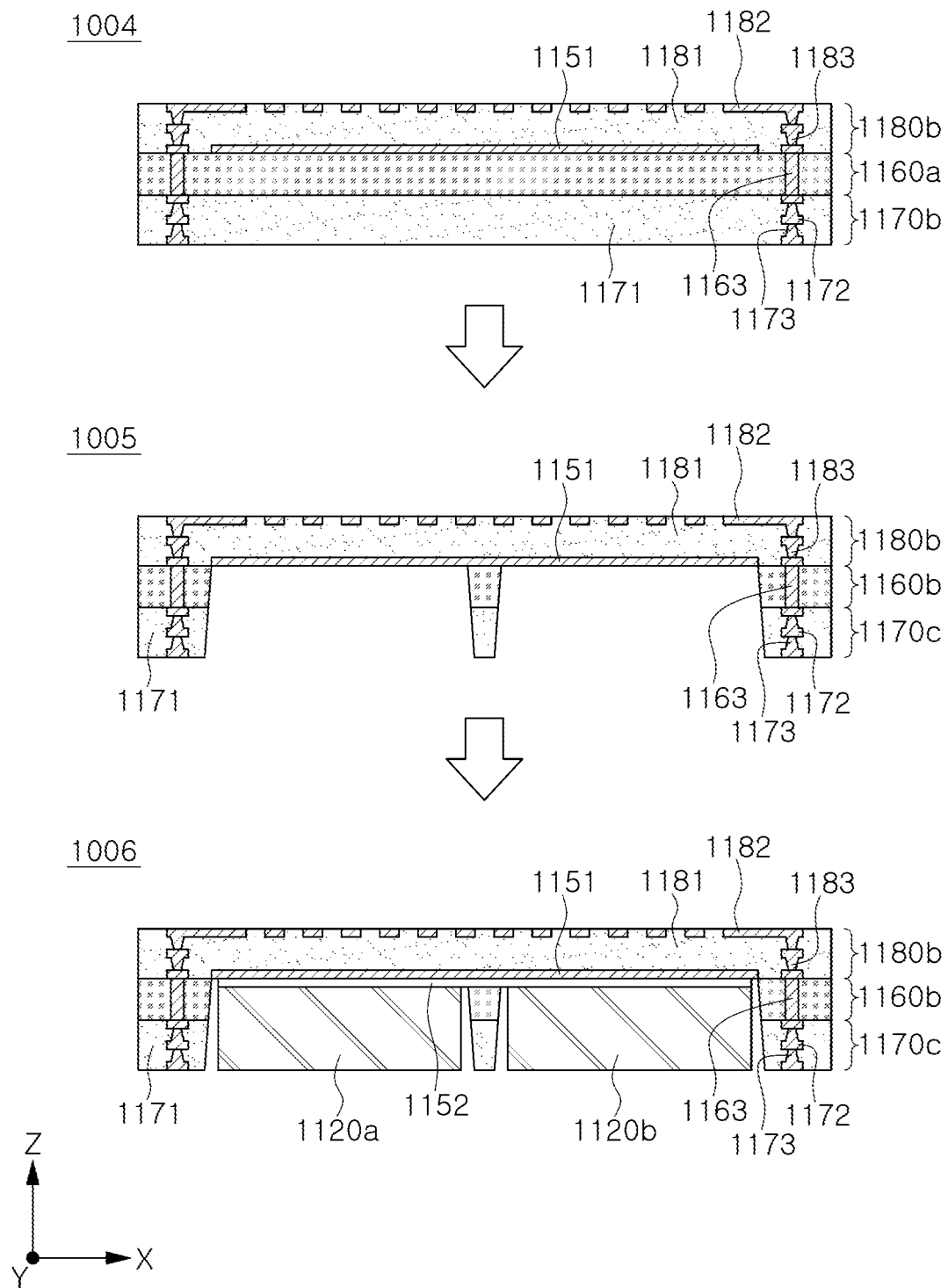

Referring to FIG. 5B, in a fourth operation 1004, a thickness of each of the third and second insulating layers 1171 and 1181 may be increased, and the third and second wiring layers 1172 and 1182 may further be stacked while the third and second vias 1173 and 1183 may be elongated. Thus, the stack number of third connection members 1170b may increase and the stack number of the second connection member 1180b may increase.

Referring to FIG. 5B, first and second cavities may be formed in the core member 1160b and the third connection member 1170c in a fifth operation 1005. For example, the first and second cavities may be formed by several fine particles or laser colliding on a certain region of the third connection member 1170c and the core member 1160b in a+z direction.

Referring to FIG. 5B, in a sixth operation 1006, the adhesive layer 1152 may be disposed in the first and second cavities, and first and second reactance components 1120a and 1120b may be respectively disposed in the first and second cavities.

Figure 5C:
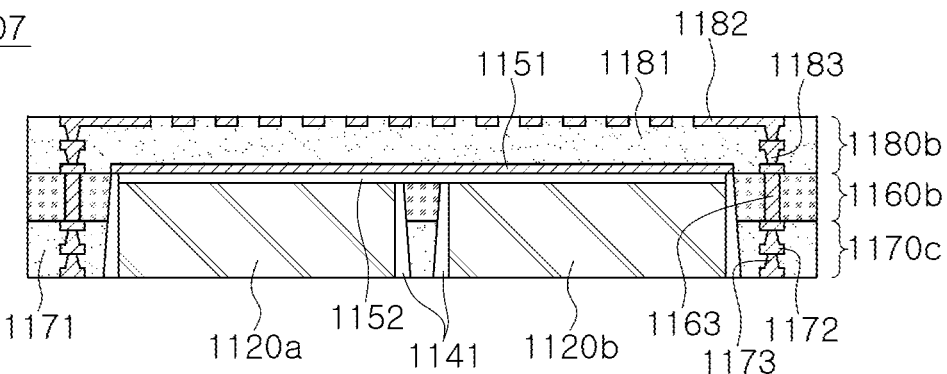
Figure 5C:
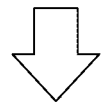
Figure 5C:
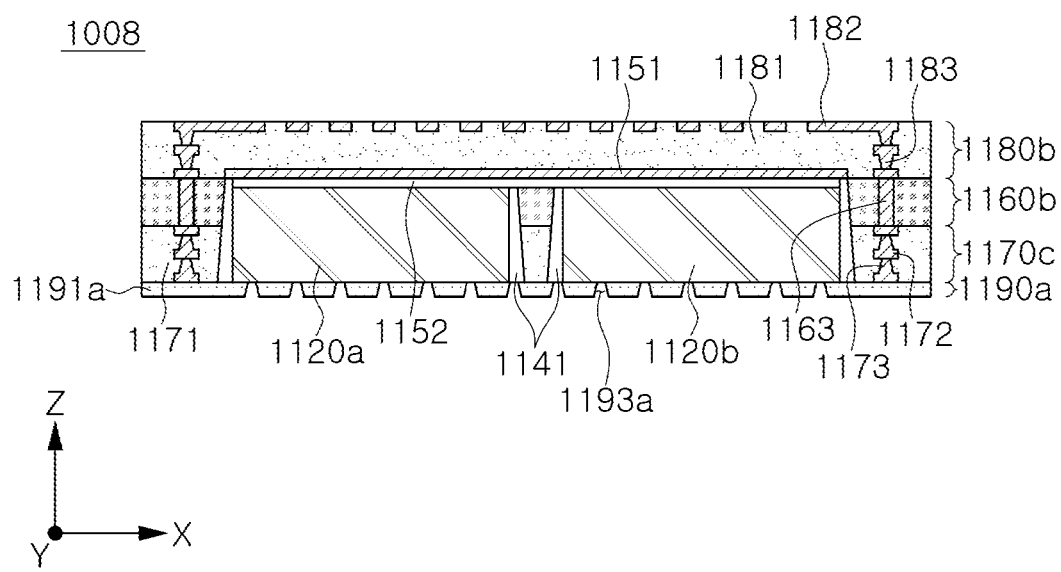

Referring to FIG. 5C, in a seventh operation 1007, a first encapsulant 1141 may be filled in a portion of the first and second cavities in which the first and second reactance components 1120a and 1120b are not located.

Referring to FIG. 5C, in an eight operation 1008, a first insulating layer 1191a may be disposed on a lower surface of the third connection member 1170c and may have a space for disposing a first via 1193a. Accordingly, partial layers of the first connection member 1190a may be formed.

Figure 5D:
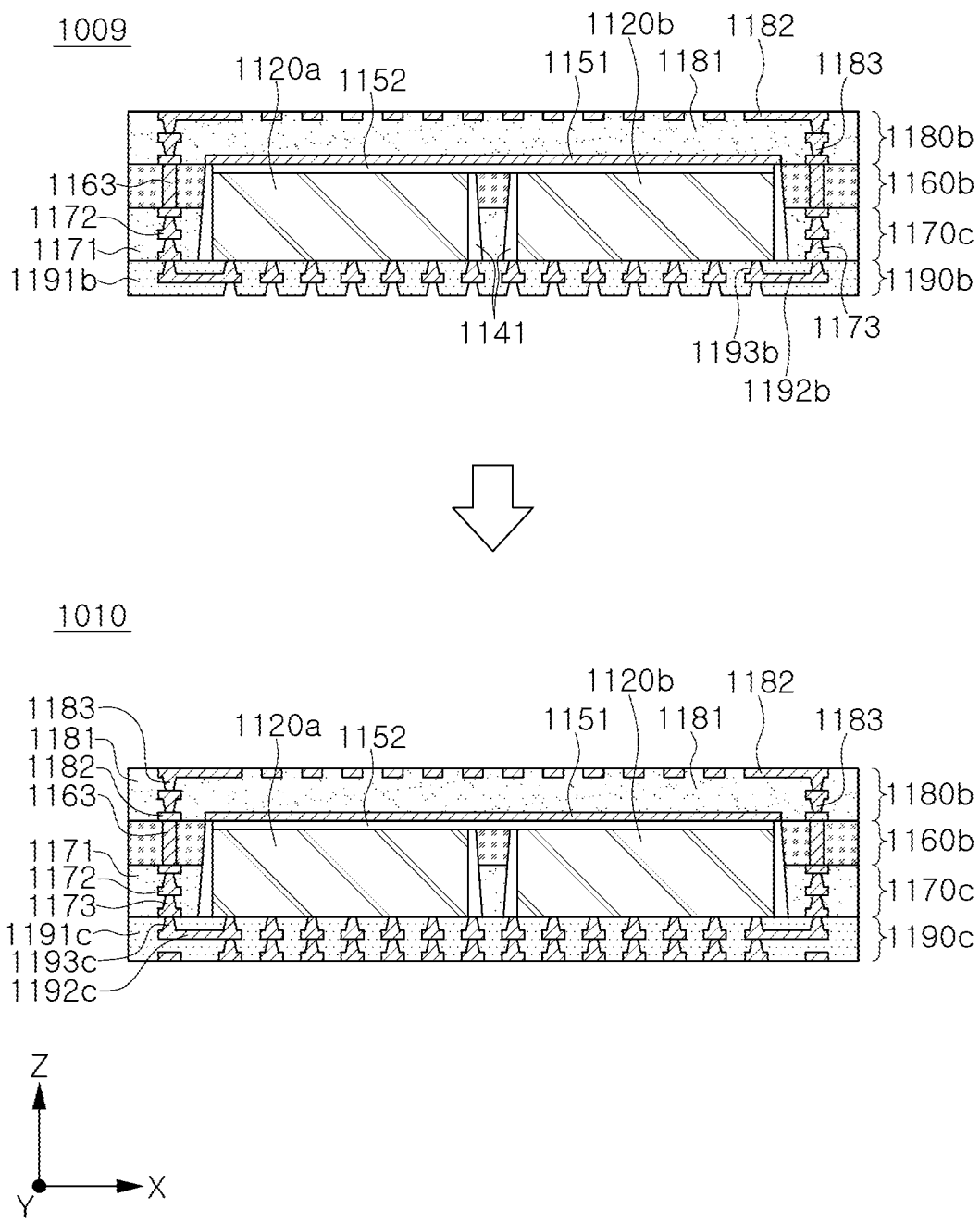

Referring to FIG. 5D, in a ninth operation 1009, a first insulating layer 1191b may be formed by increasing a thickness of the first insulating layer 1191a, and a first wiring layer 1192b and a first via 1193b may be formed in the first insulating layer 1191b. Accordingly, the stack number of first connection members 1190b may increase.

Referring to FIG. 5D, in a tenth operation 1010, s first insulating layer 1191c may be formed by increasing a thickness of the first insulating layer 1191b, and a first wiring layer 1192c and a first via 1193c may be formed in the first insulating layer 1191c. Accordingly, the stack number of the first connection members 1190b may further increase.

Figure 6:
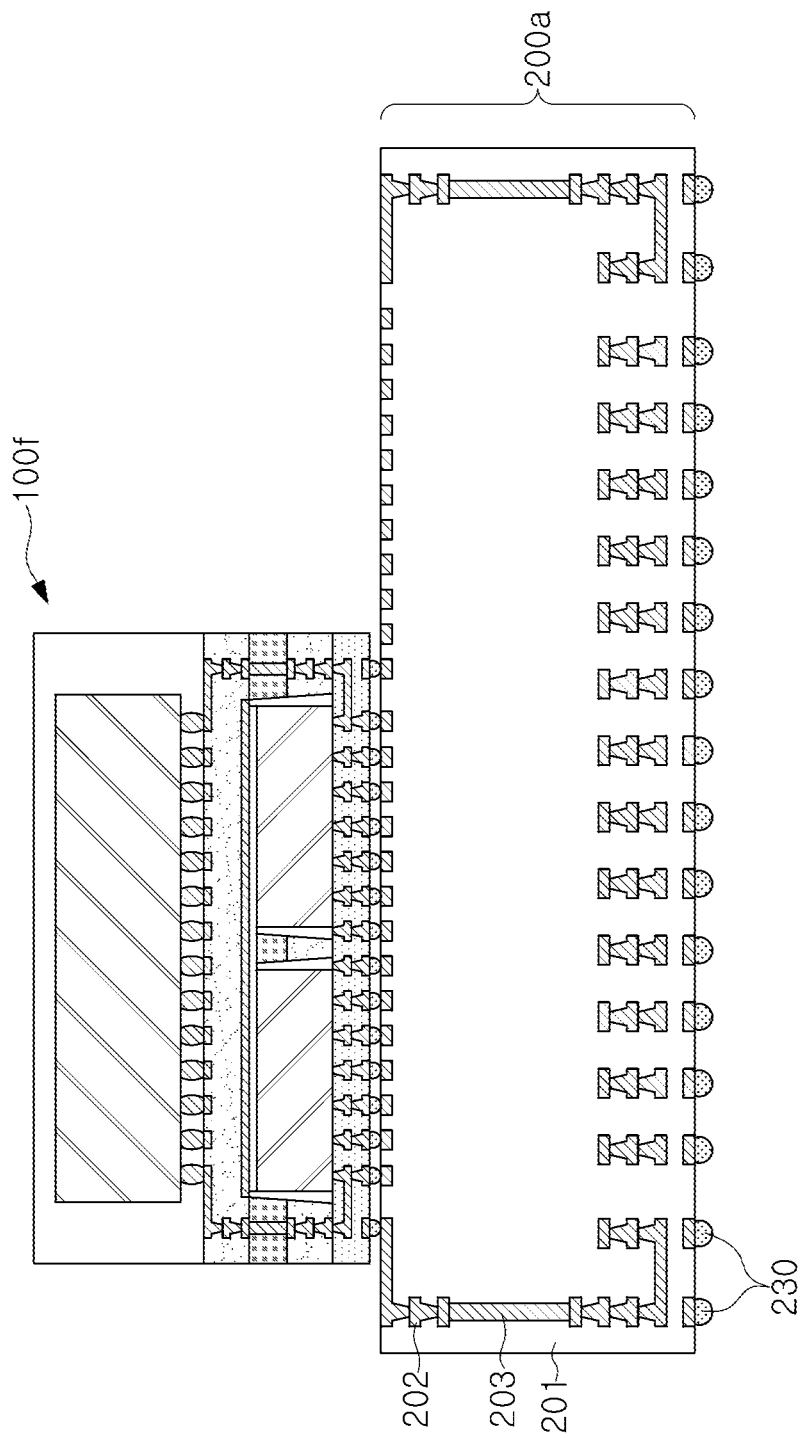
FIG. 6 is a side view illustrating the front-end module of FIG. 4 mounted on a base substrate, according to an embodiment.

FIG. 6 is a side view illustrating the front-end module 100f mounted on a base substrate 200a, according to an embodiment.

Referring to FIG. 6, the front-end module 100f may be mounted on an upper surface of the base substrate 200a. The base substrate 200a may have a structure in which a fourth insulating layer 201, a fourth wiring layer 202 and a fourth wiring via 203 are combined, and may have a structure similar to that of a PCB.

A plurality of fourth electrical connection structures 230 may be disposed on a lower surface of the second substrate 200a, and may be electrically connected to the fourth wiring layer 202 and the fourth via 203.

The plurality of fourth electrical connection structures 230 may support mounting of a chip antenna, and the chip antenna may remotely transmit and/or receive a second RF signal. Further, a portion of the plurality of fourth electrical connection structures 230 may be used as a path for inputting and/or outputting a base signal.

Depending on a design, the chip antenna may be replaced with a patch antenna pattern implemented as a pattern on the fourth wiring layer 202 of the second substrate 200a.

The second substrate 200a may be disposed in an electronic device and may be used as a part of communication means of the electronic device. The electronic device may be a smart phone, a personal digital assistant, a digital video camera, a digital still camera, a network system, a computer, a monitor, a tablet, a laptop, a netbook, a television, a video game, a smart watch, or an automotive device, but is not limited to these examples.

Figure 7A:
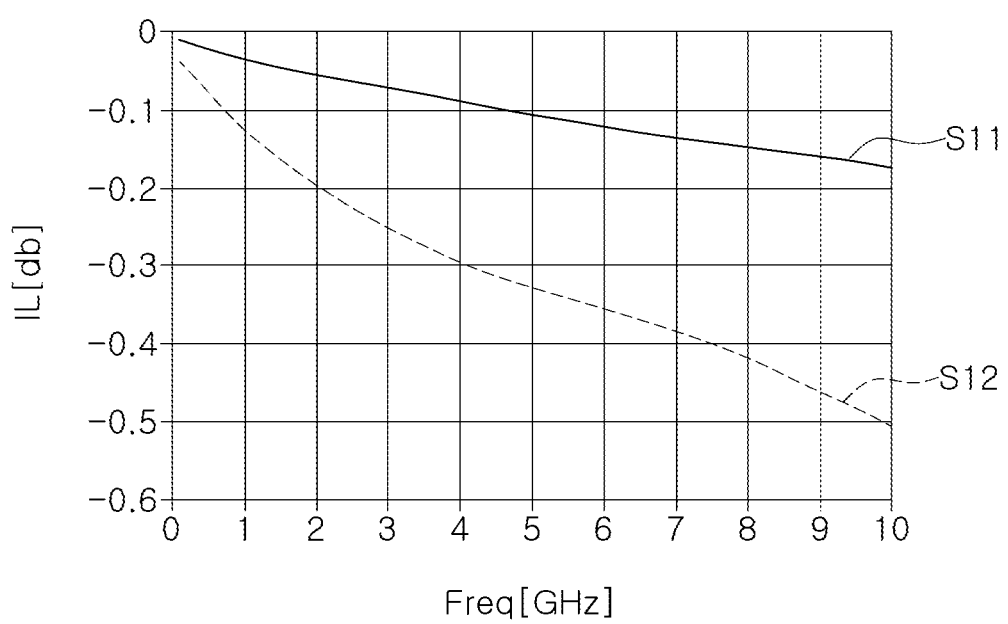
FIG. 7A is a graph illustrating improved insertion loss of a front-end module, according to an embodiment.

FIG. 7A is a graph illustrating improved insertion loss of a front-end module, according to an embodiment.

Referring to FIG. 7A, a second curve S12 indicates an insertion loss IL of a radio-frequency filter in a case in which a distance between an inductor and a ground plane is about 105 μm, and a first curve S11 indicates an insertion loss IL of a radio-frequency filter in a case in which a distance between an inductor and a ground plane is about 147 μm.

The insertion loss IL of the second curve S12 at 3.8 GHz may be about 0.287 dB, but the insertion loss IL of the first curve S11 at 3.8 GHz may be about 0.086 dB.

The front-end module, according to an embodiment, may have a distance between the inductor and the ground plane extended to 147 μm, and thus may have an insertion loss improved by about 0.2 dB in comparison to a configuration in which the distance between the inductor and the ground plane is 105 μm.

Further, a current consumed by a radio-frequency amplifier of the front-end module according to the embodiment corresponding to the first curve S11 may be reduced by about 6 mA, in comparison to the current consumed by a radio-frequency amplifier of the front-end module corresponding to the second curve S12.

Figure 7B:
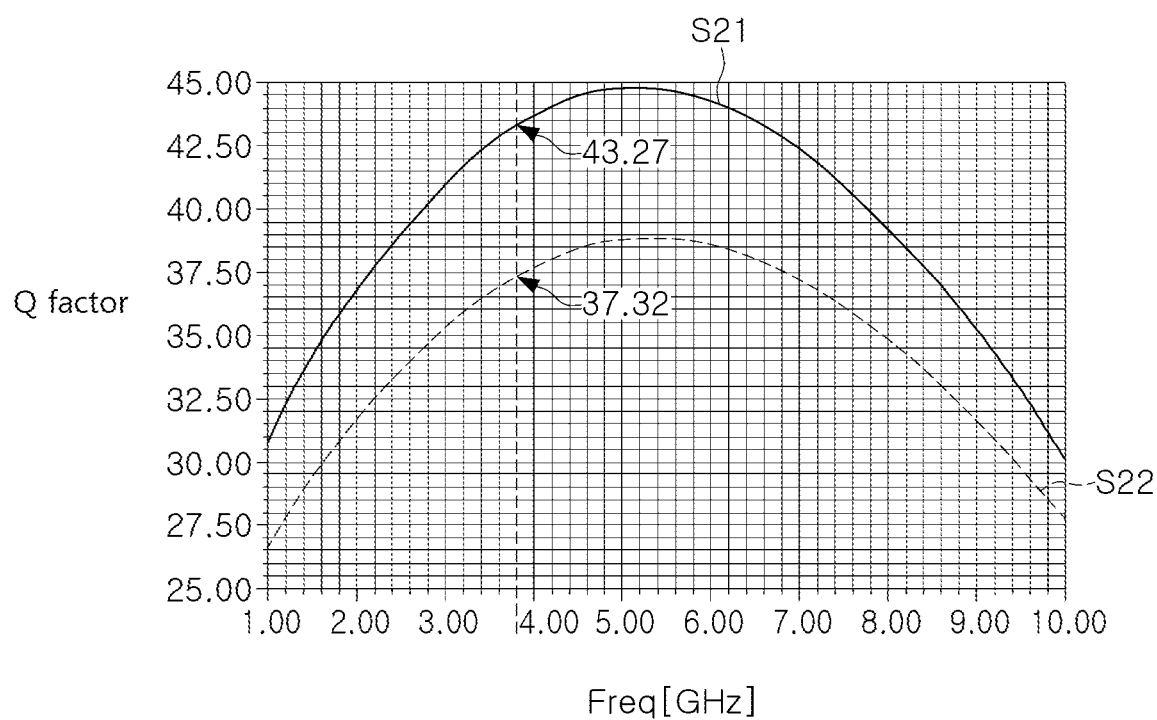
FIG. 7B is a graph illustrating an improved Q factor of a front-end module, according to an embodiment.

FIG. 7B is a graph illustrating an improved Q factor of a front-end module, according to an embodiment.

Referring to FIG. 7B, a fourth curve S22 indicates a Q factor in the case in which the distance between the inductor and the ground plane is about 105 μm, and a third curve S21 indicates a Q factor in the case in which the distance between the inductor and the ground plane is about 147 μm.

The Q factor of the fourth curve S22 at 3.8 GHz may be about 37.32, but the Q factor of the third curve S21 at 3.8 GHz may be about 43.27.

The front-end module according to an embodiment disclosed herein may have a distance between the inductor and the ground plane extended to 147 μm from 105 μm, and may thus be provided with an inductor having a Q factor improved by 15% to 20%.

The wiring layers, the vias, the ground planes and the inductors disclosed herein may contain a metal (e.g., a conductive material such as copper (Cu), aluminum (Al), silver (Ag), tin (Sn), gold (Au), nickel (Ni), lead (Pb), titanium (Ti), or alloys of Al, Ag, Sn, A, Ni, Pb, or Ti) and may be formed by a plating method such as chemical vapor deposition (CVD), physical vapor deposition (PVD), sputtering, subtractive, additive, semi-additive process (SAP), modified semi-additive process (MSAP), and the like, but are not limited to these examples.

The insulating layers disclosed herein may be implemented by prepreg, FR-4, a thermoplastic resin such as a thermosetting resin such as an epoxy resin, a resin in which the thermosetting or thermoplastic resin is impregnated with an inorganic filler in a core material such as a glass fiber(or a glass cloth or a glass fabric), or the like, Ajinomoto build-up film (ABF), bismaleimide triazine (BT), a photo-imageable dielectric (PID) resin, a copper clad laminate (CCL), a ceramic-based insulating material, or the like.

The RF signal disclosed herein may have a form according to protocols such as wireless fidelity (Wi-Fi; Institute of Electrical And Electronics Engineers (IEEE) 802.11 family, or the like), worldwide interoperability for microwave access (WiMAX; IEEE 802.16 family, or the like), IEEE 802.20, long term evolution (LTE), Ev-DO, HSPA+, HSDPA+, HSUPA+, EDGE, GSM, GPS, GPRS, CDMA, TDMA, DECT, Bluetooth, and any wireless and wired protocols designated as 3G, 4G, 5G, and beyond, but is not limited to these examples. Further, a frequency of the RF signal is not particularly limited.

A front-end module according to embodiments disclosed herein may have a highly reduced size for its performance.

For example, a front-end module according to embodiments disclosed herein may effectively provide a space for a reactance component or an inductor having a further improved Q factor.

Further, a front-end module according to embodiments disclosed herein may have simplified electrical connection paths between components and, thus, may have further reduced transmission loss of the electrical connection paths.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. In addition, respective embodiments may be combined with each other. For example, the pressing members disclosed in the above-described embodiments may be used in combination with each other in one force sensing device. Therefore, the scope of the disclosure is defined not by the detailed description, but by the claims and their equivalents, and all variations within the scope of the claims and their equivalents are to be construed as being included in the disclosure.

What is claimed is:

1. A front-end module, comprising:
   a substrate comprising:
      a first connection member having a first stack structure in which at least one first insulating layer and at least one first wiring layer are alternately stacked;
      a second connection member having a second stack structure in which at least one second insulating layer and at least one second wiring layer are alternately stacked; and
      a core member disposed between the first and second connection members;
   a radio-frequency component mounted on a first surface of the substrate and configured to amplify a main band of an input radio frequency (RF) signal or filter one or more bands outside the main band;
   an inductor disposed on a first surface of the core member and electrically connected to the radio-frequency component; and
   a ground plane disposed on a second surface of the core member,
   wherein the core member comprises a core insulating layer thicker than an insulating layer among the at least one first insulating layer and the at least one second insulating layer, and
   wherein the ground plane is disposed to overlap with at least a portion of the inductor in a normal direction of the first surface of the core member.

2. The front-end module of claim 1, wherein the ground plane is electrically connected to the radio-frequency component.

3. The front-end module of claim 1, wherein the substrate is configured to receive a pre-amplified or pre-filtered RF signal through a second surface of the substrate and provide an amplified or filtered RF signal through the second surface of the substrate.

4. The front-end module of claim 3, further comprising a second radio-frequency component mounted on the second surface of the substrate.

5. The front-end module of claim 1, further comprising a reactance component electrically connected to the radio-frequency component,
   wherein the core insulating layer forms a cavity in which the reactance component is disposed.

6. The front-end module of claim 5, wherein the substrate further comprises a third connection member disposed between the first connection member and the core member, and having a third stack structure in which at least one third insulating layer and at least one third wiring layer are alternately stacked, and
   wherein the core insulating layer and the third connection member surround the cavity.

7. The front-end module of claim 5, wherein the substrate comprises a metal layer covering the cavity and disposed between the first and second connection members, and
   wherein at least a portion of the metal layer is disposed on one surface of the reactance component.

8. The front-end module of claim 1, wherein a distance between the inductor and the ground plane is greater than 105 μm.

9. The front-end module of claim 1, wherein a distance between the inductor and the ground plane is about 147 μm.

10. A front-end module, comprising:
    a substrate comprising:

a first connection member having a first stack structure in which at least one first insulating layer and at least one first wiring layer are alternately stacked;

a second connection member having a second stack structure in which at least one second insulating layer and at least one second wiring layer are alternately stacked; and a core member disposed between the first and second connection members; a radio-frequency component mounted on a first surface of the substrate and configured to amplify a main band of an input radio frequency (RF) signal or filter one or more bands outside the main band; and a reactance component electrically connected to the radio-frequency component, wherein the core member comprises a core insulating layer thicker than an insulating layer among the at least one first insulating layer and the at least one second insulating layer, and forms a cavity in which the reactance component is disposed, and wherein the substrate further comprises a third connection member disposed between the first connection member and the core member, and having a third stack structure in which at least one third insulating layer and at least one third wiring layer are alternately stacked, and wherein the core insulating layer and the third connection member surround the cavity.

11. The front-end module of claim 10, wherein the substrate further comprises a metal layer covering the cavity and disposed between the first and second connection members, and wherein at least a portion of the metal layer is disposed on one surface of the reactance component.

12. The front-end module of claim 10, wherein the substrate is configured to receive a pre-amplified or pre-filtered RF signal through a second surface of the substrate and provide an amplified or filtered RF signal through the second surface of the substrate.

13. The front-end module of claim 12, further comprising a second radio-frequency component mounted on the second surface of the substrate.

14. The front-end module of claim 10, further comprising a second reactance component electrically connected to the radio-frequency component, wherein the core insulating layer forms a second cavity in which the second reactance component is disposed.

15. The front-end module of claim 10, further comprising an inductor disposed on a first surface of the core member and electrically connected to the radio-frequency component.

16. The front-end module of claim 10, further comprising a ground plane disposed on a second surface of the core member and electrically connected to the radio-frequency component.

* * * * *